(12) United States Patent
Wieczorek et al.

(10) Patent No.: US 6,352,885 B1
(45) Date of Patent: Mar. 5, 2002

(54) TRANSISTOR HAVING A PERIPHERALLY INCREASED GATE INSULATION THICKNESS AND A METHOD OF FABRICATING THE SAME

(75) Inventors: Karsten Wieczorek, Reichenberg-Boxdorf (DE); Frederick N. Hause, Austin, TX (US); Manfred Horstmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/579,310

(22) Filed: May 25, 2000

(51) Int. Cl.[7] .................. H01L 21/336; H01L 21/8234
(52) U.S. Cl. ................ 438/197; 438/299; 438/981
(58) Field of Search ................... 438/197, 257, 438/287, 299, 302, 585, 758, 778, 787, 981, 301

(56) References Cited

U.S. PATENT DOCUMENTS

| | | | | |
|---|---|---|---|---|
| 5,409,848 A | * | 4/1995 | Han et al. ................ | 438/302 |
| 5,637,514 A | * | 6/1997 | Jeng et al. | |
| 5,672,521 A | | 9/1997 | Barsan et al. ............. | 437/24 |
| 5,679,968 A | * | 10/1997 | Smayling et al. .......... | 257/213 |
| 5,882,993 A | | 3/1999 | Gardner et al. ............ | 438/591 |
| 5,888,880 A | | 3/1999 | Gardner et al. ............ | 438/424 |
| 5,918,133 A | | 6/1999 | Gardner et al. ............ | 438/299 |
| 5,994,747 A | * | 11/1999 | Wu ........................... | 257/408 |
| 6,013,929 A | * | 1/2000 | Ohtani ...................... | 257/349 |
| 6,077,749 A | | 1/2000 | Gardner et al. ............ | 438/299 |
| 6,136,657 A | * | 10/2000 | Yang et al. ................ | 438/303 |
| 6,191,052 B1 | * | 2/2001 | Wang ........................ | 438/775 |
| 6,207,516 B1 | * | 3/2001 | Tang ......................... | 438/301 |
| 6,225,669 B1 | * | 5/2001 | Long et al. ................ | 257/401 |

FOREIGN PATENT DOCUMENTS

JP          10163350 A  *  6/1998

OTHER PUBLICATIONS

Wolf, Silicon Processing for the VLSI Era, 1995, Lattice Press, vol. 3, 495–504.*

* cited by examiner

Primary Examiner—Matthew Smith
Assistant Examiner—Craig P. Lytle
(74) Attorney, Agent, or Firm—Williams, Morgan & Amerson, P.C.

(57) ABSTRACT

A transistor having a gate insulation layer whose peripheral portion has an increased thickness and a method of fabricating these transistor devices is disclosed. The peripheral portions with increased thickness of the gate insulation layer significantly reduce the injection of charge carriers into the gate insulation layer. Accordingly, the transistors described in the present application exhibit an improved long-time reliability. In addition, the lateral penetration of ions beneath the gate insulation layer for forming the lightly-doped drain and/or the lightly doped source is increased since the implantation may be performed at a tilt angle with respect to the perpendicular direction which is the conventionally used direction of the implantation step.

22 Claims, 3 Drawing Sheets

TRANSISTOR HAVING A PERIPHERALLY INCREASED GATE INSULATION THICKNESS AND A METHOD OF FABRICATING THE SAME

BACKGROUND OF THE INVENTION

1. Field of the Invention

The present invention relates to fabrication of integrated circuit devices and, more particularly, to a field effect transistor (FET) with an improved performance reliability regarding the injection of charge carriers into the gate insulation layer separating the gate electrode from the drain, source and channel regions of the transistor, and a method of fabricating the same.

2. Description of the Related Art

The process of manufacturing integrated circuits (IC) involves the fabrication of numerous insulated gate field effect transistors, such as metal oxide semiconductor (MOS) or metal insulation semiconductor (MIS) transistors. In order to be able to increase integration density and improve device performance, for instance, with respect to signal processing time and power consumption, feature sizes of the transistor structures are steadily decreasing. In particular, the reduced thickness of the insulation layer between the gate electrode and the channel region, as well as the reduced channel length, i.e., the lateral extension of the channel between the source and drain regions of the transistor, may cause undesirable effects in the performance of the device. These adverse effects become more important as the feature sizes of such devices continue to decrease.

One important issue in this respect is the so-called "hot carrier injection" effects that occur when device dimensions are reduced, but the supply voltage is maintained at a constant level, e.g., 5 volts. Due to the smaller device dimensions, the electric field between the source and drain regions of the transistor is enhanced compared to a device having a larger channel length when the same supply voltage is used. Additionally, this electric field is further enhanced by the electric fields of the dopant atoms in the drain and source regions and leads to an intensity peak of the superimposed field. In a MOS transistor, for example, the electrons in the channel may possibly gain sufficient energy to be injected into the gate insulation layer. This charge accumulation inside the gate insulation layer may cause longterm device degradation in that the threshold voltage of the device is raised and the transconductance is reduced. This effect predominantly occurs at the peripheral portions of the gate insulation layer, since the electric field created across the gate insulation layer is superimposed with the electric field created by the voltage across the drain and the source regions and the doped portions of these regions that extend beyond or underneath the gate insulation layer.

Although it is preferable to have a very thin gate insulation layer so as to effectively create the inversion layer in the channel region, the electric field created when a gate voltage is applied enhances the peak of the electric field near the peripheral portion of the gate insulation layer. This strongly contributes to the undesirable injection of electrons into this peripheral portion of the gate insulation layer. In order to reduce the peak of the electric field near the peripheral portions of the gate insulation layer, a lightly doped region extending beyond or underneath the peripheral portions of the gate insulation layer is formed. In highly sophisticated FET transistors, efforts are made to minimize the electrical resistance between the drain and source contacts. For example, this may involve reducing the channel length of the device and decreasing the gate insulation layer thickness to increase the electric field which affects the channel. The overall resistance of the device then strongly depends on the intrinsic resistance of the source region and, in particular, on the resistance of the drain, since the channel builds up starting from the source and becomes continually narrower as it approaches the lightly doped drain region.

With reference to FIGS. 1A–1C, an illustrative example of forming a MOS transistor according to a typical prior art process will be described. It is to be noted that FIGS. 1A–1C, as well as the following drawings of this application, are merely schematic depictions of the various stages in manufacturing the considered illustrative device. The person skilled in the relevant art will readily appreciate that the dimensions shown in the figures are not true to scale and that different portions or layers are not separated by sharp boundaries as reflected in the drawings but may instead comprise continuous transitions. Furthermore, various process steps as described below may be performed differently depending on particular design requirements. Moreover, in this description, only the relevant steps and portions of the device which are necessary for the understanding of the present invention are considered.

FIG. 1A depicts a schematic cross-section through a MOS semiconductor device at a specific stage of the manufacturing process. Within a silicon substrate 1, shallow trench isolations 2 comprised of an insulating material, e.g., silicon dioxide, are formed in the substrate 1. The trench isolations 2 define an active region 3 in which a channel, drain and source regions will be formed. Over the active region 3, a gate electrode 4 made of, for example, polycrystalline silicon, is formed. The gate electrode 4 is separated from the active region 3 by a thin gate insulation layer 5 comprised of, for example, silicon dioxide. The process steps involved in patterning the gate electrode 4 and the gate insulation layer 5 are of common knowledge to the skilled person and will herein not be described in detail.

FIG. 1B shows a schematic cross-section through the semiconductor device of FIG. 1A in an advanced fabrication stage. A thin screen oxide layer 6 is formed over the structure as shown in FIG. 1A. Screen oxide layer 6 may be deposited by chemical vapor deposition (CVD) or may be grown thermally by means of a furnace process. Lightly doped regions 7 are formed within the active region 3 extending from the shallow trench isolations 2 toward the gate electrode 4. The lightly doped regions 7 are produced by an ion implantation process with a small dose, wherein the direction of movement of the ions is substantially perpendicular to the surface of the substrate 1.

FIG. 1C shows a schematic depiction of the device in a further advanced fabrication stage. The screen oxide layer 6 has been removed and sidewall spacers 8 comprised of, for example, silicon dioxide, are formed on the sidewalls of the gate electrode 4. Subsequently, a further implantation step is performed to create a highly doped drain and source region 9, respectively. Then, the implanted regions 9 and 7 are activated by a rapid thermal anneal process that results in a lateral diffusion of the junctions between the doped drain and source regions and the inversely doped active region 3. Accordingly, the lightly doped regions 7 partially extend beyond or underneath the gate insulation layer 5. As previously discussed, such an arrangement may cause charge carriers to be injected into the gate insulation layer 5, thereby decreasing device reliability.

In view of the above-mentioned problems, a need exists for a transistor having an increased performance reliability and for a method of fabricating such a device. The present invention is directed to a method of making a semiconductor device that solves, or at least reduces, some or all of the aforementioned problems.

SUMMARY OF THE INVENTION

The present invention is directed to a transistor having a peripherally increased gate insulation thickness, and a method of making same. In one illustrative embodiment, the transistor is comprised of a substrate in which an active region is defined, a gate electrode formed above the active region, and a gate insulation layer positioned between the substrate and the gate electrode, wherein an edge region of the gate insulation layer is thicker than the middle region of the gate insulation layer.

In one illustrative embodiment, the method disclosed herein is comprised of providing a semiconductor substrate having an active region formed therein, forming a gate insulation layer above the active region, and forming a gate electrode material above the gate insulation layer. The method further comprises patterning the gate electrode material to define a gate electrode, and increasing a thickness of the gate insulation layer at an edge region thereof.

BRIEF DESCRIPTION OF THE DRAWINGS

The invention may be understood by reference to the following description taken in conjunction with the accompanying drawings, in which like reference numerals identify like elements, and in which.

Figure 1A:
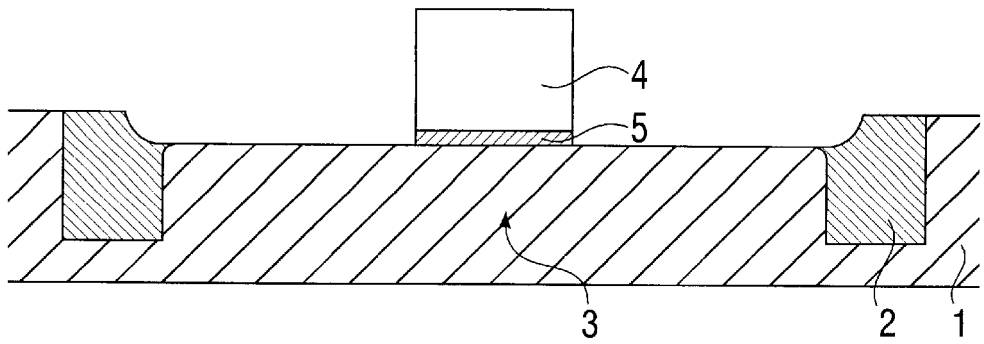
FIGS. 1A–1C are schematic cross-sectional views of various states during the formation of a field effect transistor according to a typical prior art process.
Figure 1B:
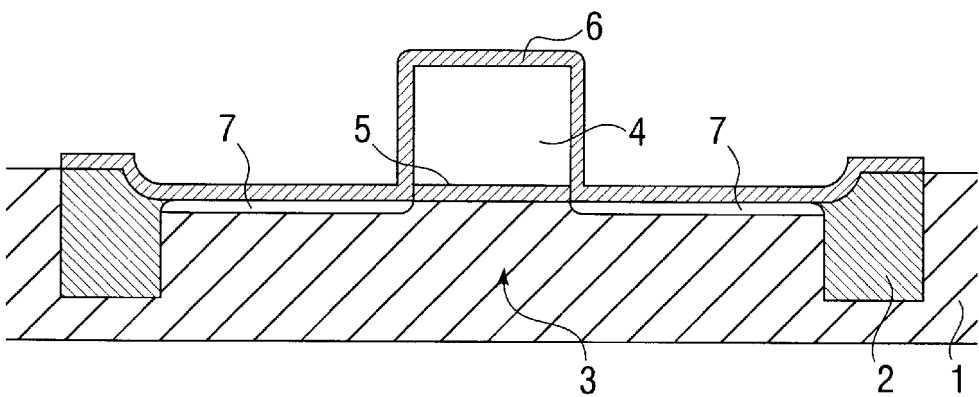
Figure 1C:
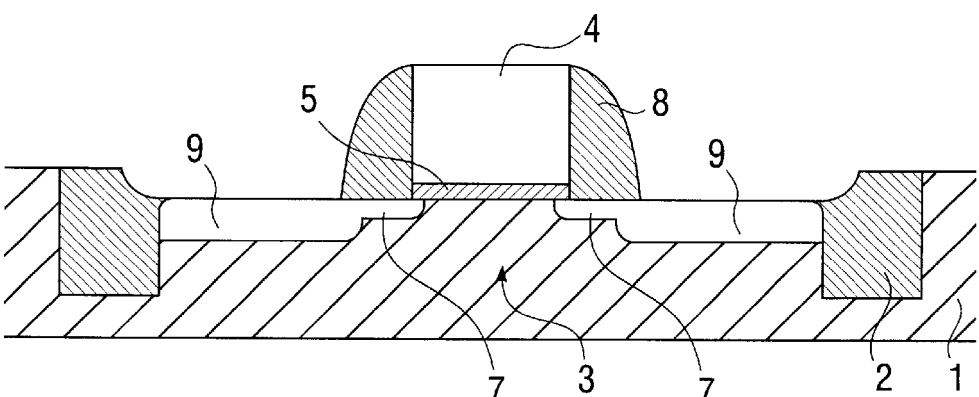

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2E. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming a transistor having a peripherally increased gate insulation thickness, and a device comprising same. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is demonstrated with reference to a MOS transistor formed in a silicon substrate, the present invention may be applied to any kind of semiconductor in which a gate structure is required. For example, the semiconductor substrate can be any appropriate material such as germanium, GaAs or other composed semiconductor structures.

Figure 2A:
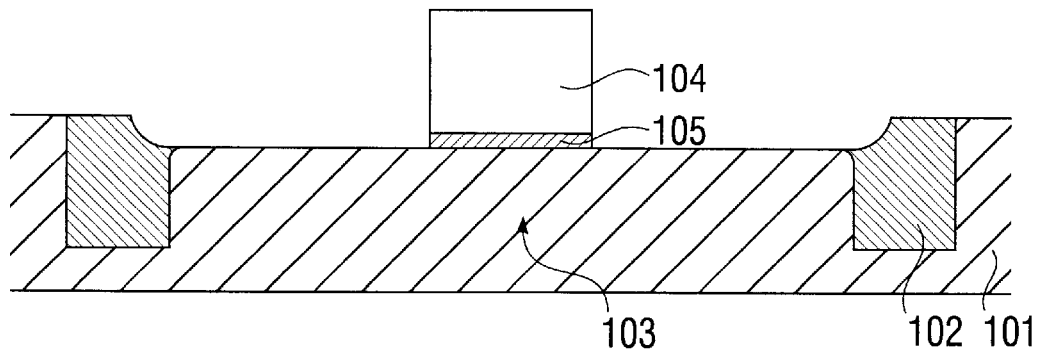
FIGS. 2A–2E are schematic cross-sectional views depicting various stages of the formation of a field effect transistor according to one illustrative embodiment of the present invention.

FIGS. 2A–2E depict schematic cross-sectional views of an illustrative MOS transistor during various procedural steps of the fabrication method according to one embodiment of the present invention. In FIG. 2A, shallow trench isolations 102 comprised of, for example, silicon dioxide ($SiO_2$), are formed within a silicon substrate 101. The trench isolations 102 define an active region 103 in the substrate 101. The active region 103 has a length dimension, which is defined as the lateral extension of the active region 103 in the direction which is parallel to the surface of the substrate and lies in the drawing plane of FIGS. 2A–2E, and it has a width dimension extending along a direction perpendicular to the drawing plane of FIGS. 2A–2E.

As shown in FIG. 2A, a gate electrode 104 is formed over the active region 103. The gate electrode 104 may be comprised of a variety of materials, such as polycrystalline silicon, and it may have a thickness ranging from approximately 1000–3000 Å. Of course, the thickness of the gate electrode 104 may be decreased as technological advances continue to be made in the art. The gate electrode 104 may be formed by a variety of techniques, such as depositing a layer of the appropriate material and patterning the layer of material using known photolithography and etching processes.

The gate electrode 104 is isolated from the active region 103 by a thin gate insulation layer 105. The gate insulation layer 105 may be formed from a variety of materials used to electrically isolate the gate electrode 4 from the active region 103, e.g., an oxide, an oxynitride, a nitride, silicon dioxide, silicon oxynitride, silicon nitride, various high-k dielectrics, etc., and it may be formed by a variety of techniques, such as thermal growing, deposition, etc. In one illustrative embodiment, the gate insulation layer 105 is comprised of a thermally grown layer of silicon dioxide having a thickness ranging from approximately 15–50 Å.

Figure 2B:
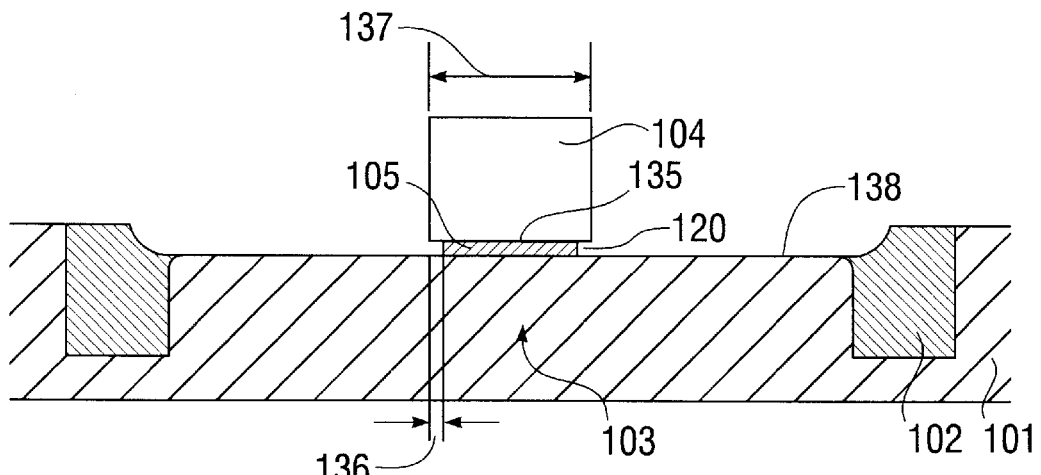

In FIG. 2B, the arrangement of FIG. 2A is shown, wherein an etching process, such as a wet etching process, has been performed in order to under-etch the gate electrode 104 so as to form a gap 120 between the bottom surface 135 of the gate electrode 104 and the surface 138 of the substrate 101 along the perimeter or periphery of the gate insulation layer 105. In the illustrative embodiment shown in FIGS. 2A–2E, the lateral extension 136 of the gap 120 is about 10% of the gate length 137 of the gate electrode 104. For example, for a 200 nm gate length 137, the lateral extension 136 of the gap 120 would be approximately 20 nm. By varying the parameters controlling the etching process, e.g., etch time and chemistry, the lateral extension 136 can be adjusted to any desired value. Preferably, the parameters of the etching process are selected so as to achieve a lateral extension 136 of the gap 120 in the range of approximately 5–20% of the gate length 137 of the gate electrode 104.

Figure 2C:
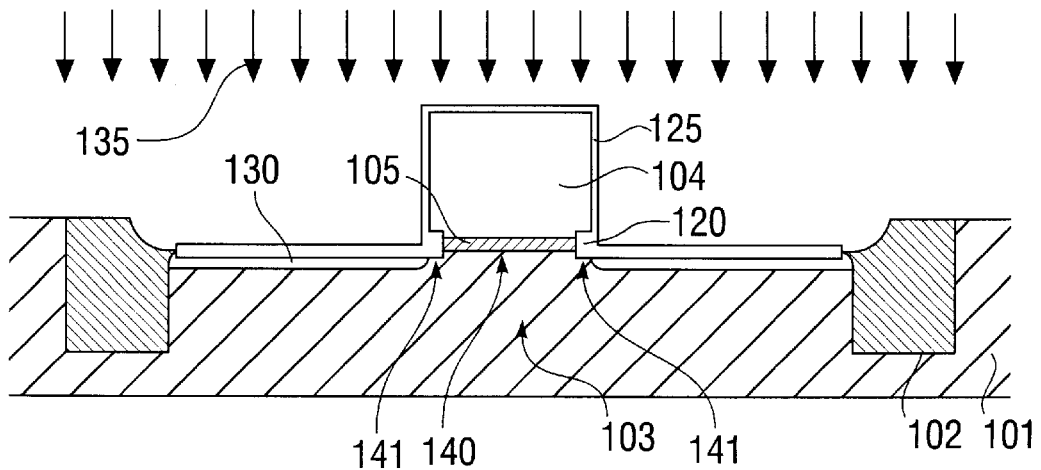

In FIG. 2C, a thin screen oxide layer 125 has been grown thermally on the structure of FIG. 2B. The growing of the screen oxide layer 125 may be performed in a nitrogen ambient, which may comprise, for example, $N_2O_2$, $N_2O$ or NO compounds, since the presence of nitrogen atoms in the gate insulation layer 105 supports the suppression of the injection of charge carriers into the gate insulation layer 105. In one illustrative embodiment, the thickness of the screen oxide layer 125 is substantially the same as the thickness of the gate insulation layer 105. During the growth of the screen oxide layer 125, the gap 120 is also filled with silicon dioxide.

During the course of the oxidation process, the $Si-SiO_2$ interface moves down into the silicon substrate 101. That is, for the growth of an oxide layer of thickness "d," a silicon layer of a thickness of approximately 0.44 d is consumed. The growth process concurrently starts from the bottom surface 135 of the polycrystalline silicon gate electrode 104, as well as from the surface 138 of the active region 103. Thus, the gap 120 will be reliably filled with silicon dioxide when the thickness of the grown screen oxide layer 125 is approximately the same as the thickness of the gate insulation layer 105.

Accordingly, the gap 120, that is now filled with screen oxide material, e.g., silicon dioxide, represents a peripheral portion or edge region 141 of the gate insulation layer 105 having an increased thickness compared to the initially formed thickness of the gate insulation layer 105. That is, the gate insulation layer 105 may be considered to have a middle region 140 and an edge region 141 in which the edge region 141 is thicker than the middle region 140. In the illustrative embodiment depicted in FIG. 2C, the edge region 141 is approximately twice as thick as the middle region 140 of the gate insulation layer 105. Of course, the thickness ratio between the edge region 141 and the middle region 140 of the gate insulation layer 105 may be varied depending upon the particular device being fabricated. Additionally, depending upon the materials selected for use, the middle region 140 and edge region 141 may be comprised of the same or different materials.

Moreover, the gate insulation layer 105, comprised of the middle region 140 and edge regions 141, may be considered to have an overall length that corresponds approximately to the final gate length of the gate electrode 104. The edge regions 141 of the gate insulation layer 105 may comprise approximately 10–40% of the overall length of the gate insulation layer 105. That is, each edge region 141 may comprise approximately 5–20% of the overall length of the gate insulation layer 105 when fabrication of the device is completed.

As discussed above, the degree to which the peripheral portion of the gate insulation layer 105 is increased depends, at least in part, on the thickness of the screen oxide layer 125. In one embodiment, the edges regions 141 of the gate insulation layer 105 are each approximately 1.5–2 times the original thickness of the gate insulation layer 105. For example, when the screen oxide layer 125 and the gate insulation layer 105 have approximately the same thickness, the edge regions 141 are approximately twice as thick as the middle region 140 of the gate insulation later 105. Of course, the relative thicknesses of the edge regions 141 and the middle region 140 of the gate insulation layer 105 may be varied.

Lightly doped regions 130 are thereafter formed under the screen oxide layer 125 by an ion implantation process, wherein the direction of movement of the ions is substantially perpendicular to the surface 138 of the active region 103. The direction of this implantation is indicated by arrows 135 in FIG. 2C.

Figure 2D:
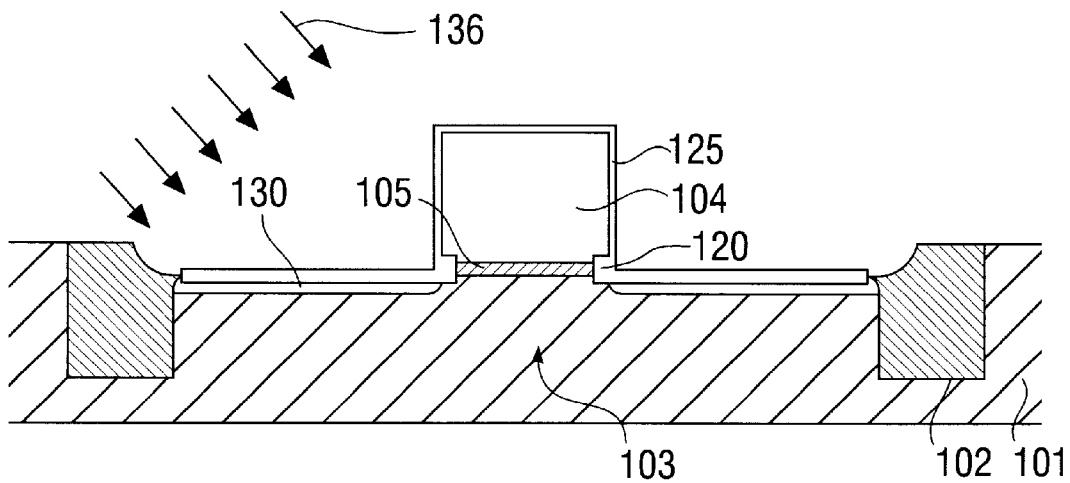

FIG. 2D is a schematic view of a subsequent procedural step performed on the structure as shown in FIG. 2C. A second ion implantation process with a small dose may be performed at an angle with respect to the first implantation step so as to yield a deeper lateral penetration underneath the gate insulation layer 105 at a drain side of the active region 103 to minimize parasitic resistances. This angled implantation step is indicated by arrows 136. Since there is generally a large amount of transistor devices on a semiconductor substrate, the reduction of the parasitic resistances at the drain of the device concerns all transistor devices on the substrate. If a deeper lateral penetration of the dopants at the source side of the transistor is also desired, the first implantation step may be performed at a corresponding tilt angle or, alternatively, a third implantation step with a small dose may be performed so as to achieve the desired effect.

A tilted implantation process may be performed with a semiconductor device having a gate insulation layer 105 without the increased peripheral thickness described herein so as to reduce the parasitic resistances. Particularly advantageous is the fact, however, that the tilted implantation process shown in FIG. 2D may be performed in conjunction with a transistor device having a gate insulation layer 105 with an increased peripheral thickness. Such a device may result in dramatically less deterioration of the transistor performance than is the case in a device having a uniform gate insulation thickness. Of course, the particular implantation process discussed herein should not be considered a limitation of the present invention unless specifically set forth in the attached claims.

Figure 2E:
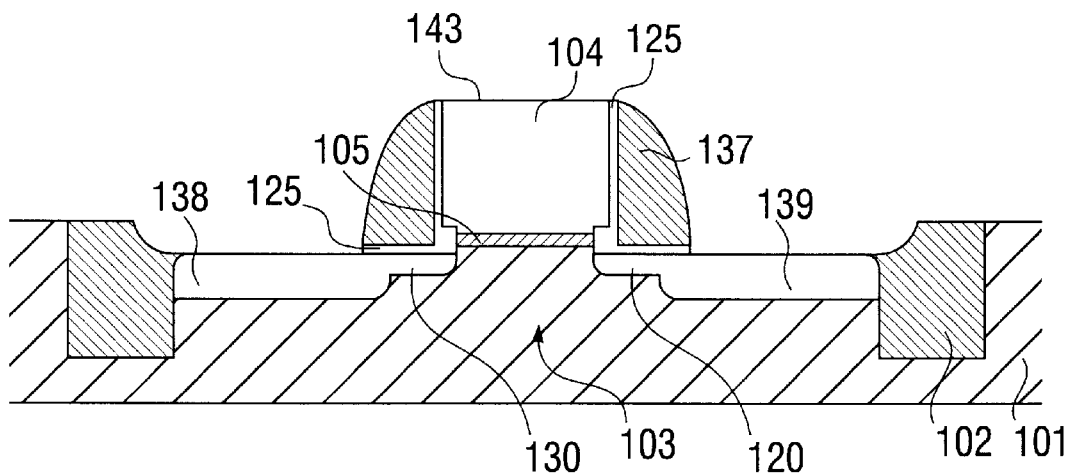

In FIG. 2E, sidewall spacers 137 have been formed on the sidewalls 141 of the gate electrode 104. Moreover, a drain 138 and a source 139 have been formed by an ion implantation process performed with a high concentration of dopant atoms. The screen oxide layer 125 may also be removed from the drain 138, source 139 and the top surface 143 of the gate electrode 104. Subsequently, the drain 138 and source 139 junctions are annealed by a rapid thermal anneal process, wherein the parameters are selected so as to drive the dopants of the lightly doped drain region 130 laterally deeper under the peripherally increased thickness portion of the gate insulation layer 105, but not beneath the middle region 140 of the gate insulation layer 105.

A MOS transistor produced in accordance with the present invention tends to exhibit a significantly reduced tendency towards device degradation caused by the injection of charged carriers into the gate insulation layer 105 due to the increased thickness of the edge regions 141 of the gate insulation layer 105 in the vicinity of the lightly doped regions. Moreover, by means of the tilted implantation during the formation of the lightly doped drain region and/or the lightly doped source region, the parasitic resistance of this area can also be reduced, thereby improving the signal performance of the device.

According to one embodiment of the present invention, a method of manufacturing a semiconductor device comprises the steps of: providing a semiconductor substrate 101 having a surface comprising an active region 103, forming a gate insulation layer 105 over the active region 103, depositing a gate electrode material on the gate insulation layer, patterning the gate electrode material to form a gate electrode 104 therefrom, and increasing a thickness of the gate insulation layer 105 at a peripheral portion or edge region 141 thereof.

In one illustrative embodiment, the step of increasing the thickness of the gate insulation layer 105 comprises the steps of: removing a part of the gate insulation layer 105 not covered by the gate electrode 104, removing a peripheral portion of the gate insulation layer 105 covered by the gate electrode 104 to form a gap 120, and growing a screen oxide layer 125 over the substrate 101 by oxidizing the surface 138 of the substrate 101 and the bottom surface 135 of the gate electrode 104, thereby filling the gap 120 with the screen oxide.

In another illustrative embodiment of the present invention, there is provided a transistor in an integrated circuit comprising: a semiconductor substrate 101 in which an active region 103 is defined, a gate electrode 104 formed over the active region 103, a gate insulation layer 105 disposed between the substrate 101 and the gate electrode 104 for electrically insulating the gate electrode 104 from the active region 103, wherein a peripheral portion or edge region 141 of the gate insulation layer 105 has a thickness that is larger than a thickness of the middle region 140 of the gate insulation layer 105 to thereby reduce charge carrier injection into the gate insulation layer 105. In one particularly illustrative embodiment, the thickness of the edge region 141 of the gate insulation layer 105 is at least approximately two times the thickness of the middle region 140 of the gate insulation layer 105.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a field effect transistor, comprising the steps:
   providing a semiconductor substrate having a surface comprising an active region;
   forming a gate insulation layer above the active region;
   forming a gate electrode material above the gate insulation layer;
   patterning the gate electrode material to form a gate electrode therefrom, said gate electrode having a top surface;
   removing an edge portion of the originally-formed gate insulation layer covered by the gate electrode to form a gap adjacent each side of said gate insulation layer between said gate electrode and said active region;
   performing an oxidation process to grow a screen oxide layer by oxidizing the surface of the substrate, the top surface of said gate electrode and a portion of a bottom surface of the gate electrode, thereby filling the gaps with the screen oxide; and performing at least one ion implant process through said screen oxide layer.

2. The method of claim 1, wherein forming a gate insulation layer above the active region comprises depositing a gate insulation layer above the active region.

3. The method of claim 1, wherein forming a gate insulation layer above the active region comprises thermally growing a gate insulation layer above the active region.

4. The method of claim 1, wherein forming a gate insulation layer above the active region comprises forming a gate insulation layer comprised of at least one of an oxide, an oxynitride, silicon dioxide, and silicon nitride above the active region.

5. The method of claim 1, wherein forming a gate electrode material above the gate insulation layer comprises depositing a gate electrode material above the gate insulation layer.

6. The method of claim 1, wherein forming a gate electrode material above the gate insulation layer comprises forming a gate electrode material comprised of polycrystalline silicon above the gate insulation layer.

7. The method of claim 1, wherein patterning the gate electrode material to form a gate electrode therefrom comprises etching the gate electrode material to form a gate electrode therefrom.

8. The method of claim 1, wherein performing an oxidation process to grow a screen oxide layer by oxidizing the surface of the substrate, the top surface of said gate electrode and a portion of a bottom surface of the gate electrode, thereby filling the gaps with the screen oxide, comprises performing an oxidation process to grow a screen oxide layer by oxidizing the surface of the substrate, the top surface of said gate electrode and a portion of a bottom surface of the gate electrode in an ambient comprising nitrogen, thereby filling the gaps with the screen oxide.

9. The method of claim 1, wherein performing an oxidation process to grow a screen oxide layer by oxidizing the surface of the substrate, the top surface of said gate electrode and a portion of a bottom surface of the gate electrode, thereby filling the gaps with the screen oxide, comprises performing an oxidation process to grow a screen oxide layer by oxidizing the surface of the substrate, the top surface of said gate electrode and a portion of a bottom surface of the gate electrode in an ambient comprising at least one of $N_2O_2$, $N_2O$, and NO, thereby filling the gaps with the screen oxide.

10. The method of claim 1, wherein performing an oxidation process to grow a screen oxide layer by oxidizing the surface of the substrate, the top surface of said gate electrode and a portion of a bottom surface of the gate electrode, thereby filling the gaps with the screen oxide, comprises performing an oxidation process to grow a screen oxide layer having a thickness equal to or larger than a thickness of the gate insulation layer as initially formed by oxidizing the surface of the substrate, the top surface of said gate electrode and a portion of a bottom surface of the gate electrode, thereby filling the gaps with the screen oxide.

11. The method of claim 1, wherein removing an edge portion of the originally-formed gate insulation layer covered by the gate electrode to form a gap between said gate electrode and said active region adjacent each side of said gate insulation layer comprises under-etching the gate electrode to form a gap adjacent each side of said gate insulation layer between said electrode and said active region.

12. The method of claim 1, wherein performing an oxidation process to grow a screen oxide layer by oxidizing the surface of the substrate, the top surface of said gate electrode and a portion of a bottom surface of the gate electrode, thereby filling the gaps with the screen oxide, comprises performing an oxidation process to grow a screen oxide layer by oxidizing the surface of the substrate, the top surface of said gate electrode and a portion of a bottom surface of the gate electrode, thereby filling the gaps with the screen oxide, each gap having a lateral dimension that is approximately 5–20% of a length of said gate electrode.

13. The method of claim 1, further comprising:
forming lightly doped drain regions and lightly doped source by implanting ions having a primary moving direction substantially perpendicular to the surface of the substrate, and
implanting ions moving in a direction that forms a tilt-angle with respect to the surface of the substrate so as to achieve a deeper lateral penetration of the ions under the gate insulation layer, thereby forming a low resistance region.

14. A method of manufacturing a field effect transistor, comprising the steps:
providing a semiconductor substrate comprised of silicon having a surface comprising an active region;
forming a gate insulation layer above the active region;
depositing a gate electrode material comprised of polysilicon above the gate insulation layer;
etching the gate electrode material to form a gate electrode therefrom, said gate electrode having a top surface;
removing an edge portion of the originally-formed gate insulation layer covered by the gate electrode to form a gap adjacent each side of said gate insulation layer between said gate electrode and said active region;
performing an oxidation process to grow a screen oxide layer by oxidizing the surface of the substrate, the top surface of said gate electrode and a portion of a bottom surface of the gate electrode, thereby filling the gaps with the screen oxide; and performing at least one ion implant process through said screen oxide layer.

15. The method of claim 14, wherein forming a gate insulation layer above the active region comprises depositing a gate insulation layer above the active region.

16. The method of claim 14, wherein forming a gate insulation layer above the active region comprises thermally growing a gate insulation layer above the active region.

17. The method of claim 14, wherein forming a gate insulation layer above the active region comprises forming a gate insulation layer comprised of at least one of an oxide, an oxynitride, silicon dioxide, and silicon nitride above the active region.

18. The method of claim 14, wherein performing an oxidation process to grow a screen oxide layer by oxidizing the surface of the substrate and a portion of a bottom surface of the gate electrode, thereby filling the gaps with the screen oxide, comprises performing an oxidation process to grow a screen oxide layer by oxidizing the surface of the substrate and a portion of a bottom surface of the gate electrode in an ambient comprising at least one of $N_2O_2$, $N_2O$, and NO, thereby filling the gaps with the screen oxide.

19. The method of claim 14, wherein performing an oxidation process to grow a screen oxide layer by oxidizing the surface of the substrate and a portion of a bottom surface of the gate electrode, thereby filling the gaps with the screen oxide, comprises performing an oxidation process to grow a screen oxide layer having a thickness equal to or larger than a thickness of the gate insulation layer as initially formed by oxidizing the surface of the substrate and a portion of a bottom surface of the gate electrode, thereby filling the gaps with the screen oxide.

20. The method of claim 14, wherein removing an edge portion of the originally-formed gate insulation layer covered by the gate electrode to form a gap between said gate electrode and said active region adjacent said gate insulation layer comprises under-etching the gate electrode to form a gap adjacent each side of said gate insulation layer between said electrode and said active region.

21. The method of claim 14, wherein performing an oxidation process to grow a screen oxide layer by oxidizing the surface of the substrate and a portion of a bottom surface of the gate electrode, thereby filling the gaps with the screen oxide, comprises performing an oxidation process to grow a screen oxide layer by oxidizing the surface of the substrate and a portion of a bottom surface of the gate electrode, thereby filling the gaps with the screen oxide, each of said gaps having a lateral dimension that is approximately 5–20 percent of the gate length of said gate electrode.

22. The method of claim 14, further comprising:
forming lightly doped drain regions and lightly doped source by implanting ions having a primary moving direction substantially perpendicular to the surface of the substrate, and
implanting ions moving in a direction that forms a tilt-angle with respect to the surface of the substrate so as to achieve a deeper lateral penetration of the ions under the gate insulation layer, thereby forming a low resistance region.

* * * * *